(12) United States Patent
Yoshioka et al.

(10) Patent No.: US 11,264,899 B2
(45) Date of Patent: Mar. 1, 2022

(54) SEMICONDUCTOR DEVICE

(71) Applicants: Kabushiki Kaisha Toshiba, Minato-ku (JP); Toshiba Electronic Devices & Storage Corporation, Minato-ku (JP)

(72) Inventors: Akira Yoshioka, Yokohama (JP); Toru Sugiyama, Musashino (JP); Masaaki Iwai, Yokohama (JP); Naonori Hosokawa, Yokohama (JP); Masaaki Onomura, Setagaya (JP); Hung Hung, Kawasaki (JP); Yasuhiro Isobe, Ota (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 217 days.

(21) Appl. No.: 16/745,457

(22) Filed: Jan. 17, 2020

(65) Prior Publication Data

US 2021/0083577 A1 Mar. 18, 2021

(30) Foreign Application Priority Data

Sep. 17, 2019 (JP) .............................. JP2019-168195

(51) Int. Cl.
*H03K 17/081* (2006.01)
*H02M 3/158* (2006.01)
(Continued)

(52) U.S. Cl.
CPC ........... *H02M 3/158* (2013.01); *H02M 3/337* (2013.01); *H03K 17/08104* (2013.01);
(Continued)

(58) Field of Classification Search
CPC .... H02M 3/158; H02M 3/337; H02M 1/0058; H02M 1/088; H02M 7/5387;
(Continued)

(56) References Cited

U.S. PATENT DOCUMENTS

| | | | |
|---|---|---|---|
| 8,487,667 B2 | 7/2013 | Iwamura | |
| 9,806,706 B2 | 10/2017 | Hasegawa et al. | |
| 2015/0171750 A1* | 6/2015 | Zeng | H01L 27/0605 323/311 |

FOREIGN PATENT DOCUMENTS

| | | |
|---|---|---|
| JP | 2011-166673 A | 8/2011 |
| JP | 2016-208080 A | 12/2016 |
| JP | 2018-088754 A | 6/2018 |

* cited by examiner

*Primary Examiner* — Sibin Chen
(74) *Attorney, Agent, or Firm* — Oblon, McClelland, Maier & Neustadt, L.L.P.

(57) ABSTRACT

A semiconductor device according to embodiments includes a normally-off transistor having a first electrode, a second electrode, and a first control electrode, a normally-on transistor having a third electrode electrically connected to the second electrode, a fourth electrode, and a second control electrode, a first element having a first end portion electrically connected to the first control electrode and a second end portion electrically connected to the first electrode, and the first element including a first capacitance component; and, a second element having a third end portion electrically connected to the first control electrode and the first end portion and a fourth end portion, and the second element including a second capacitance component, wherein, when a threshold voltage of the normally-off transistor is denoted by $V_{th}$, a maximum rated gate voltage of the normally-off transistor is denoted by $V_{g\_max}$, a voltage of the fourth end portion is denoted by $V_{g\_on}$, the first capacitance component is denoted by $C_a$, and the second capacitance component is denoted by $C_b$, $V_{th}<(C_b/(C_a+C_b))V_{g\_on}<V_{g\_max}$.

13 Claims, 6 Drawing Sheets

(51) Int. Cl.
*H02M 3/337* (2006.01)
*H03K 17/74* (2006.01)
*H03K 17/10* (2006.01)
H03K 17/687 (2006.01)
H02M 1/00 (2006.01)

(52) U.S. Cl.
CPC ........... *H03K 17/102* (2013.01); *H03K 17/74* (2013.01); *H02M 1/0058* (2021.05); *H03K 2017/6875* (2013.01)

(58) Field of Classification Search
CPC ........... H03M 17/08104; H03M 17/74; H03M 17/102; H03M 17/6871; H03M 17/567; H03K 2017/6875; H03K 2017/66
See application file for complete search history.

SEMICONDUCTOR DEVICE

CROSS-REFERENCE TO RELATED APPLICATION

This application is based upon and claims the benefit of priority from Japanese Patent Application No. 2019-168195, filed on Sep. 17, 2019, the entire contents of which are incorporated herein by reference.

FIELD

Embodiments described herein relate generally to Semiconductor Device.

BACKGROUND

As a material for next-generation power semiconductor devices, a group-III nitride, for example, a GaN (gallium nitride)-based semiconductor has been expected. The GaN-based semiconductor has a large bandgap in comparison with Si (silicon). For this reason, in comparison with an Si (silicon) semiconductor device, by using a GaN-based semiconductor device, a power semiconductor device with a small size and a high breakdown voltage can be implemented. In addition, accordingly, a parasitic capacitance can be reduced, and thus, a power semiconductor device with high-speed driving can be implemented.

Generally, a high electron mobility transistor (HEMT) structure using a two-dimensional electron gas (2DEG) as carriers is applied to a GaN-based transistor. A typical HEMT is a normally-on transistor which becomes conductive even when no voltage is applied to the gate. For this reason, there is a problem in that it is difficult to implement a normally-off transistor which does not become conductive if no voltage is applied to the gate.

In such a power supply circuit for dealing with a large power of several hundred volts to one thousand volts, the normally-off operation is required in terms of emphasis on safety. Therefore, a circuit configuration for implementing the normally-off operation by connecting a normally-on GaN-based transistor and a normally-off Si transistor has been proposed.

DETAILED DESCRIPTION

Figure 1:
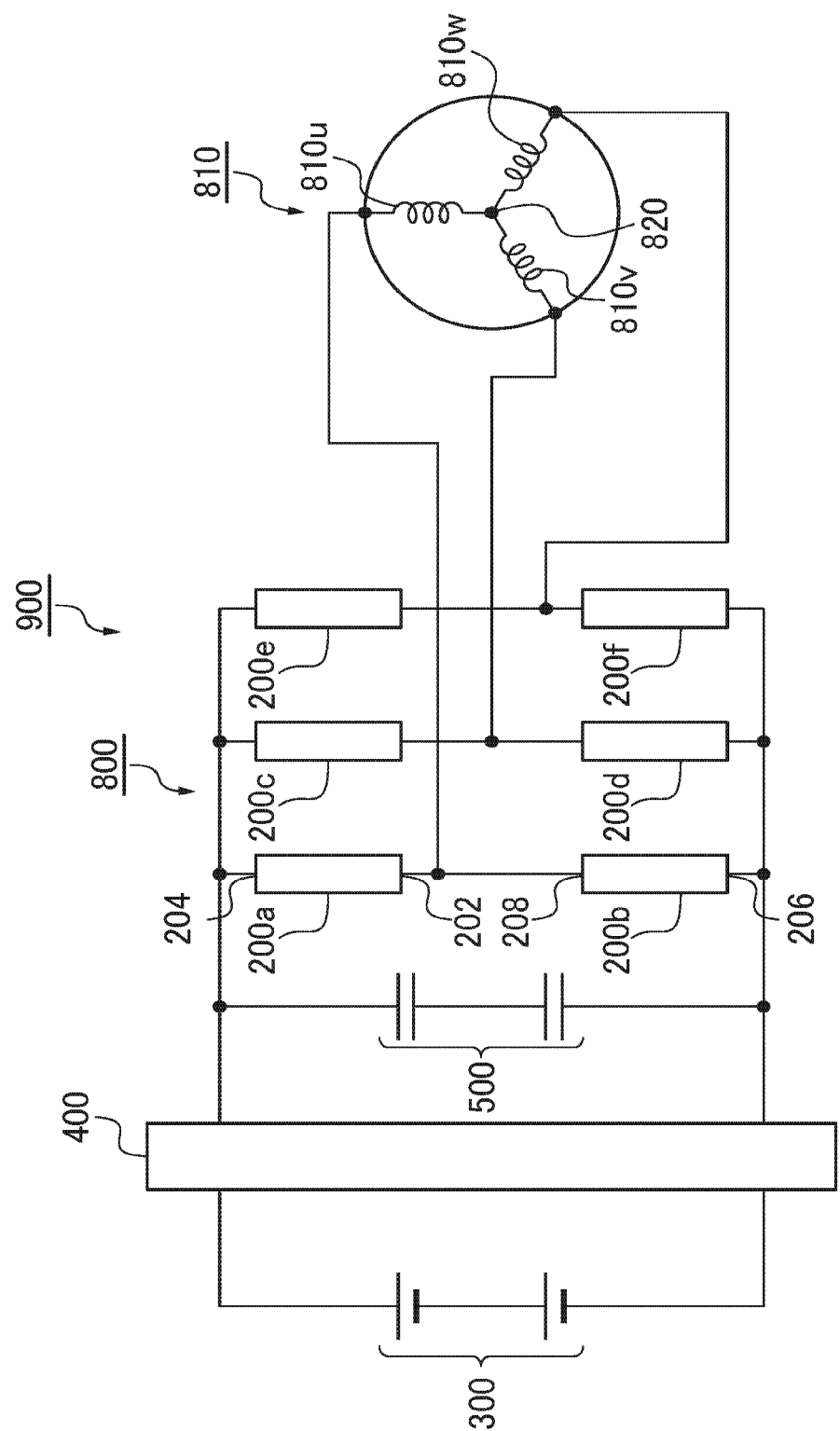
FIG. 1 is a schematic diagram of a power conversion system of a first embodiment.

A semiconductor device of an embodiment includes a normally-off transistor having a first electrode, a second electrode, and a first control electrode; a normally-on transistor having a third electrode electrically connected to the second electrode, a fourth electrode, and a second control electrode; a first element having a first end portion electrically connected to the first control electrode and a second end portion electrically connected to the first electrode, and the first element including a first capacitance component; and a second element having a third end portion electrically connected to the first control electrode and the first end portion and a fourth end portion, and the second element including a second capacitance component, wherein, when a threshold voltage of the normally-off transistor is denoted by $V_{th}$, a maximum rated gate voltage of the normally-off transistor is denoted by $V_{g\_max}$, a voltage of the fourth end portion is denoted by $V_{g\_on}$, the first capacitance component is denoted by $C_a$, and the second capacitance component is denoted by $C_b$, $V_{th} < (C_b/(C_a+C_b))V_{g\_on} < V_{g\_max}$.

Hereinafter, embodiments will be described with reference to the accompanying drawings. In addition, in the following description, in some cases, the same or similar members are denoted by the same reference numerals. In addition, in some cases, description of the once-described member or the like is omitted as appropriate.

In addition, in this specification, a semiconductor device is a concept including a power module obtained by incorporating a plurality of elements such as discrete semiconductors, an intelligent power module obtained by incorporating a drive circuit for driving a plurality of elements such as discrete semiconductors or a self protection function into the plurality of elements, or an entire system including the power module or the intelligent power module.

In addition, in this specification, a "GaN-based semiconductor" is a generic name of semiconductors having GaN (gallium nitride), AlN (aluminum nitride), InN (indium nitride), and an intermediate composition thereof.

First Embodiment

A semiconductor device of this embodiment includes a normally-off transistor having a first electrode, a second electrode, and a first control electrode; a normally-on transistor having a third electrode electrically connected to the second electrode, a fourth electrode, and a second control electrode; a first element having a first end portion electrically connected to the first control electrode and a second end portion electrically connected to the first electrode, and the first element including a first capacitance component; and a second element having a third end portion electrically connected to the first control electrode and the first end portion and a fourth end portion, and the second element including a second capacitance component, wherein, when a threshold voltage of the normally-off transistor is denoted by $V_{th}$, a maximum rated gate voltage of the normally-off transistor is denoted by $V_{g\_max}$, a voltage of the fourth end portion is denoted by $V_{g\_on}$, the first capacitance component is denoted by $C_a$, and the second capacitance component is denoted by $C_b$, $V_{th} < (C_b/(C_a+C_b)) V_{g\_on} < V_{g\_max}$.

The first element is a first capacitor having a fifth end portion and a sixth end portion, and includes a first capacitance. The first end portion is the fifth end portion, the second end portion is the sixth end portion, and the first capacitance component is the first capacitance.

FIG. 1 is a schematic diagram of a power conversion system 900 of this embodiment.

The power conversion system 900 includes a power conversion device 800 and a motor 810.

The power conversion device 800 includes transistors 200a, 200b, 200c, 200d, 200e, and 200f, a DC power supply 300, a converter 400, and a smoothing capacitor 500. In addition, as described below, the transistors 200a, 200b, 200c, 200d, 200e, and 200f may also include a plurality of transistors and the other elements.

The DC power supply 300 outputs a DC voltage. The converter 400 is a DC-DC converter and converts the DC voltage output by the DC power supply 300 to other DC voltage. The smoothing capacitor 500 smooths the voltage output by the converter 400.

Each of the transistors 200a, 200b, 200c, 200d, 200e, and 200f includes a semiconductor device 100 described later. The DC voltage smoothed by the smoothing capacitor 500 is converted into an AC voltage by the transistors 200a, 200b, 200c, 200d, 200e, and 200f.

For example, the transistor 200a has a first transistor electrode 202 and a second transistor electrode 204. The transistor 200b has a third transistor electrode 206 and a fourth transistor electrode 208. The transistor 200a and the transistor 200b are electrically connected to each other by electrically connecting the first transistor electrode 202 and the fourth transistor electrode 208.

Similarly, the transistor 200c and transistor 200d are electrically connected to each other, and the transistor 200e and the transistor 200f are electrically connected to each other.

The motor 810 has coils 810u, 810v, and 810w. Ends of the coils 810u, 810w, and 810v are electrically connected to each other at a neutral point 820. The other end of the coil 810u is electrically connected between the transistor 200a and the transistor 200b. The other end of the coil 810v is electrically connected between the transistor 200c and transistor 200d. In addition, the other end of the coil 810w is electrically connected between the transistor 200e and the transistor 200f.

In addition, the ground in the power conversion device 800 of this embodiment may be electrically connected, for example, between the plurality of smoothing capacitors 500 provided. In addition, the ground in the power conversion device 800 may be electrically connected to, for example, a wire where the transistor 200b, the transistor 200d, and the transistor 200f are electrically connected to each other.

Figure 2:
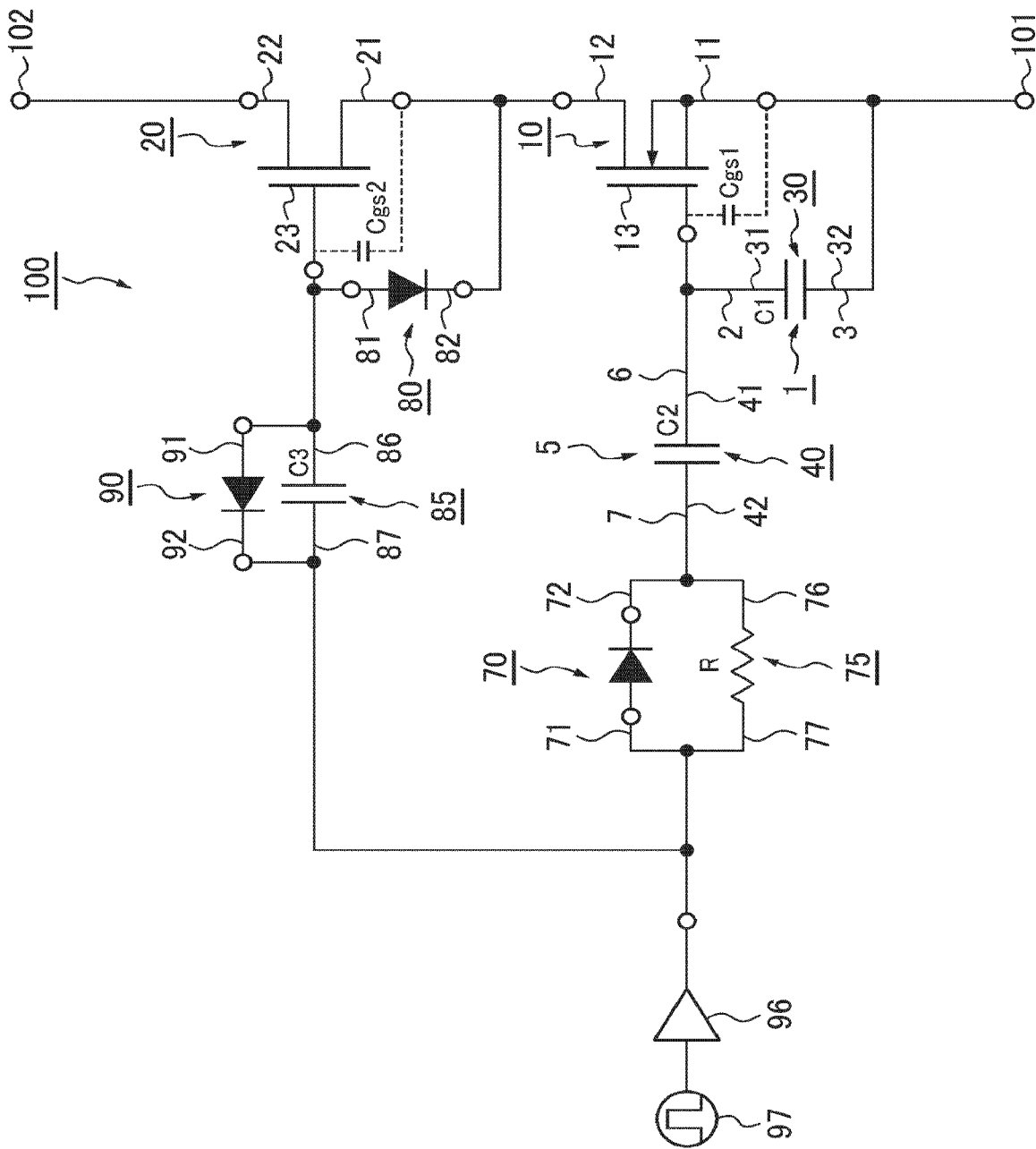
FIG. 2 is a circuit diagram of a semiconductor device of the first embodiment.

FIG. 2 is a circuit diagram of the semiconductor device 100 of this embodiment. The semiconductor device 100 of this embodiment is a power module having a rated voltage of, for example, 600 V and 1200 V.

The semiconductor device 100 includes a normally-off transistor 10, a normally-on transistor 20, a first element 1, a second element 5, a first diode 80, a second diode 90, a third capacitor 85, a third diode 70, a resistor 75, a gate drive circuit 96, and a signal source 97.

The normally-off transistor 10 has a first electrode 11, a second electrode 12, and a first control electrode 13.

The normally-off transistor 10 is a transistor in which a drain current does not flow in a case where a voltage is not input to the gate. The normally-off transistor 10 is, for example, an n-type metal oxide semiconductor field effect transistor (MOSFET) using an Si (silicon) semiconductor. For example, the first electrode 11 is the source electrode, the second electrode 12 is the drain electrode, and the first control electrode 13 is the gate electrode. However, the normally-off transistor 10 is not limited thereto. For example, the normally-off transistor 10 may be a p-type MOSFET.

$C_{gs1}$ is a parasitic capacitance of the normally-off transistor 10. It is preferable that the first capacitance component is 10 times or more larger than $C_{gs1}$ in order to input a stable voltage that is independent of the parasitic capacitance $C_{gs1}$ of the normally-off transistor 10 between the first control electrode 13 and the first electrode 11. In addition, the normally-off transistor 10 includes a parasitic body diode (not illustrated).

The breakdown voltage of the normally-off transistor 10 is, for example, 10 V or more and 30 V or less.

The normally-on transistor 20 has a third electrode 21, a fourth electrode 22, and a second control electrode 23. The third electrode 21 is electrically connected to the second electrode 12. In addition, the second terminal 102 is electrically connected to the fourth electrode 22.

The normally-on transistor 20 is a transistor in which a drain current flows even in a case where a voltage is not input to the gate. The normally-on transistor 20 is, for example, an HEMI using a GaN-based semiconductor. For example, the third electrode 21 is the source electrode, the fourth electrode 22 is the drain electrode, and the second control electrode 23 is the gate electrode.

The breakdown voltage of the normally-on transistor 20 is higher than the breakdown voltage of the normally-off transistor 10. The breakdown voltage of the normally-on transistor 20 is, for example, 600 V or more and 1200 V or less.

$C_{gs2}$ is a parasitic capacitance of the normally-on transistor 20.

The first element 1 has a first end portion 2 and a second end portion 3. The first end portion 2 is electrically connected to the first control electrode 13. The second end portion 3 is electrically connected to the first electrode 11.

The first element 1 in this embodiment is a first capacitor 30. The first capacitor 30 has a fifth end portion 31 and a sixth end portion 32. In addition, the first capacitor 30 includes a first capacitance $C_1$. The fifth end portion 31 is the first end portion 2, the sixth end portion 32 is the second end portion 3, and the first capacitance component $C_a$ is the first capacitance $C_1$. In addition, the first terminal 101 is electrically connected to the sixth end portion 32 and the first electrode 11.

The second element 5 has a third end portion 6 and a fourth end portion 7. The third end portion 6 is electrically connected to the first control electrode 13 and the first end portion 2.

The second element 5 in this embodiment is a second capacitor 40. The second capacitor 40 has a seventh end portion 41 and an eighth end portion 42. In addition, the second capacitor 40 includes a second capacitance $C_2$. The seventh end portion 41 is the third end portion 6, the eighth end portion 42 is the fourth end portion 7, and the second capacitance component $C_b$ is the second capacitance $C_2$.

The semiconductor device 100 of this embodiment implements a normally-off operation by electrically connecting the normally-off transistor 10 and the normally-on transistor 20 in series. For example, in a case where the semiconductor device 100 is used in the transistor 200b (FIG. 1), the third transistor electrode 206 is electrically connected to the first electrode 11 and the sixth end portion 32 via the first terminal 101, and the fourth transistor electrode 208 is electrically connected to the fourth electrode 22 via the second terminal 102.

The third diode 70 has an anode 71 (an example of a fifth anode) and a cathode 72 (an example of a fifth cathode). The cathode 72 is electrically connected to the fourth end portion (the eighth end portion 42).

The resistor 75 has an end portion 76 (an example of an eleventh end portion) and an end portion 77 (an example of a twelfth end portion). The end portion 76 is electrically connected to the fourth end portion 7 (the eighth end portion 42) and the cathode 72. The end portion 77 is electrically connected to the anode 71. The resistor 75 is provided in parallel with the third diode 70.

The first diode 80 has an anode 81 (an example of a third anode) and a cathode 82 (an example of a third cathode). The anode 81 is electrically connected to the second control electrode 23. The cathode 82 is electrically connected to the second electrode 12 (third electrode 21).

The third capacitor 85 has an end portion 86 (an example of a ninth end portion) and an end portion 87 (an example of a tenth end portion). The end portion 86 is electrically connected to the second control electrode 23 and the anode 81.

The second diode 90 has an anode 91 (an example of a fourth anode) and a cathode 92 (an example of a fourth cathode). The anode 91 is electrically connected to the second control electrode 23, the anode 81, and the end portion 86. The cathode 92 is electrically connected to the end portion 87. The second diode 90 is provided in parallel with the third capacitor 85.

The first diode 80, the second diode 90, and the third diode 70 are preferably Schottky barrier diodes having a high response speed. In addition, the first diode 80, the second diode 90, and the third diode 70 may be PN junction diodes, and even in the case, the diodes can be preferably used.

The first capacitor 30, the second capacitor 40, and third capacitor 85 are preferably ceramic capacitors. This is because a ceramic capacitor is excellent in frequency characteristic. However, the first capacitor 30, the second capacitor 40, and the third capacitor 85 may be other film capacitors, aluminum electrolytic capacitors, tantalum electrolytic capacitors, or the like, and even in the case, the capacitors can be preferably used.

The signal source 97 outputs, for example, a signal of a square wave or the like.

The gate drive circuit 96 is connected to the signal source 97, the anode 71, the end portion 77, the end portion 87, and the cathode 92. In addition, the gate drive circuit 96 is electrically connected to the second control electrode 23 via the second diode 90 and is electrically connected to the first control electrode 13 via the third diode 70 or the second element 5. The gate drive circuit 96 outputs a signal for driving the normally-off transistor 10 and the normally-on transistor 20 on the basis of the signal output from the signal source 97.

The gate drive circuit 96 is an IC obtained by incorporating a plurality of elements into one chip or an electronic circuit board on which a plurality of electronic components are arranged.

When a threshold voltage of the normally-off transistor 10 is denoted by $V_{th}$, a maximum rated gate voltage of the normally-on transistor 20 is denoted by $V_{g\_max}$, a voltage of the fourth end portion 7 is denoted by $V_{g\_on}$, the first capacitance component is denoted by $C_a$, and the second capacitance component is denoted by $C_b$, $V_{th}<(C_b/(C_a C_b))$ $V_{g\_on}<V_{g\_max}$. In addition, if the voltage drop across the third diode 70 and the resistor 75 is ignored, the voltage $V_{g\_on}$, the fourth end portion 7 can be considered to be equal to the output voltage of the gate drive circuit 96. Hereinafter, the output voltage of the gate drive circuit 96 is described to be $V_{g\_on}$. In addition, $V_{g\_on}$ is the voltage measured by setting the voltage of the first terminal 101 or the voltage of the first electrode 11 as a reference. Herein, the phrase "setting the voltage . . . as a reference" denotes, for example, "setting the voltage . . . to 0 V".

Figure 3A:
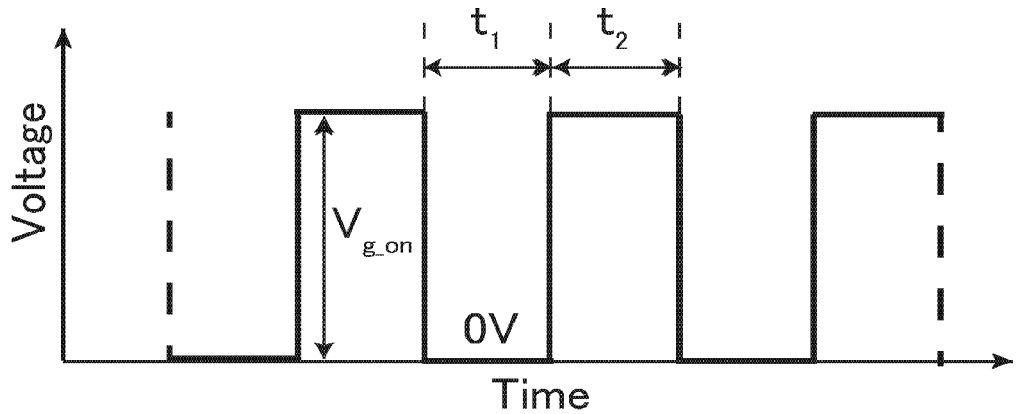
FIGS. 3A to 3C are schematic diagrams illustrating examples of $V_{g\_on}$.
Figure 3B:
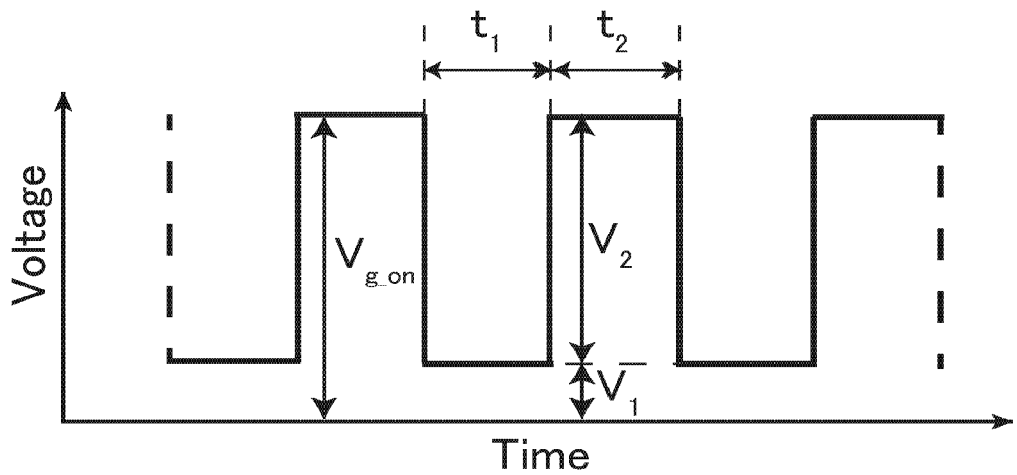
Figure 3C:
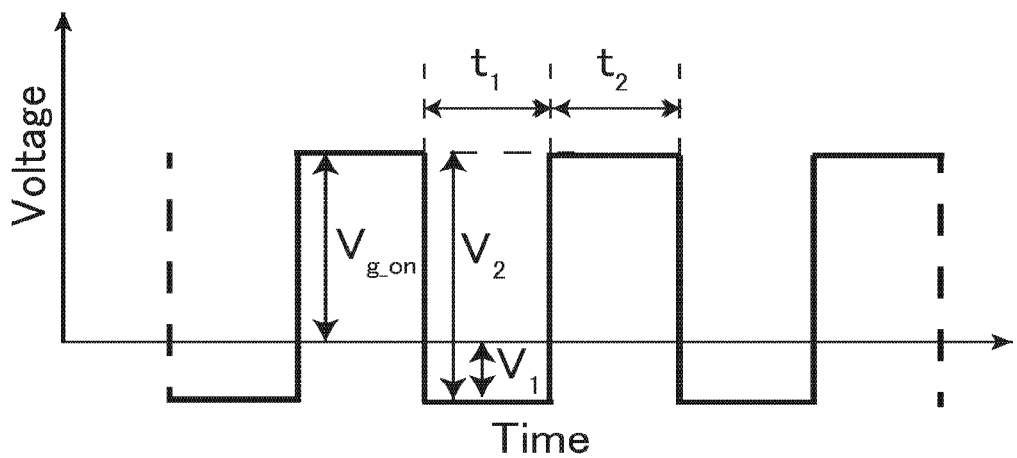

FIGS. 3A to 3C are schematic diagrams illustrating examples of $V_{g\_on}$. FIG. 3A illustrates a case where the output voltage of the gate drive circuit 96 is a square wave where 0 V output during the time $t_1$ and $V_{g\_on}$ output during the time $t_2$ repeat. FIG. 3B illustrates a case where the output voltage of the gate drive circuit 96 is a square wave where $V_1$ output during the time $t_1$ and a sum of $V_1$ and $V_2$ output during the time $t_2$ repeat. In the case of FIG. 3B, $V_{g\_on}=V_1+V_2$ ($V_{g\_on}=|V_1|+|V_2|$). FIG. 3C illustrates a case where a negative voltage is output during the time $t_1$. In the case of FIG. 3C, $V_{g\_on}=|V_2|-|V_1|$. Thus, the output voltage of the gate drive circuit 96 is a time varying voltage. Then, for example, the maximum voltage out of the output voltages of the gate drive circuit 96 is $V_{g\_on}$. In addition, although $t_1=t_2$ is illustrated in FIGS. 3A to 3C, $t_1$ and $t_2$ may be different. In addition, the time varying manner of the output voltage of the gate drive circuit 96 is not limited to those illustrated in FIGS. 3A to 3C. In addition, $V_{g\_on}$ can be easily measured by using a commercially available oscilloscope or the like.

Next, operations of the semiconductor device 100 of this embodiment are described.

For example, a square wave which reciprocates between 0 V and $V_{g\_on}$ as illustrated in FIG. 3A is output by using the signal source 97 and the gate drive circuit 96.

When $V_{g\_on}$ is output from the gate drive circuit 96, a current flows from the third capacitor 85 via the first diode 80. A voltage corresponding to a forward voltage $V_F$ of the first diode 80 is input between the second control electrode 23 and the third electrode 21. As a result, the normally-on transistor 20 is turned "on". On the other hand, when 0 V is output from the gate drive circuit 96, a current flows through a parasitic capacitance $C_{gs2}$ to the third capacitor 85. A negative voltage ($V_2-V_{g\_on}$) corresponding to the difference between $V_2$ and $V_{g\_on}$ is input between the second control electrode 23 and the third electrode 21. Thus, it is possible to turn "off" the normally-on transistor 20.

In addition, when $V_{g\_on}$ is output from the gate drive circuit 96, a voltage input between the first control electrode 13 and the first electrode 11 is $(C_b/(C_a+C_b))V_{g\_on}$. Thus, if $V_{th}<(C_b/(C_a+C_b))V_{g\_on}$, the normally-off transistor 10 is turned "on". In addition, when 0 V is output from the gate drive circuit 96, the normally-off transistor 10 is turned "off".

Herein, when the semiconductor device 100 is transitioned from "off" to "on", it is preferable that the normally-off transistor 10 is turned "on" earlier than the normally-on transistor 20. This is because, if the normally-on transistor 20 is turned "on" earlier, a high voltage is applied to a connection portion between the second electrode 12 and the third electrode 21, and thus, there is a concern that the characteristics of the normally-off transistor 10 having a low breakdown voltage are deteriorated.

In the semiconductor device 100 of this embodiment, when the semiconductor device 100 is to be transitioned from the "off" state to the "on" state, the current output from the gate drive circuit 96 flows through the third diode 70. For this reason, the charging of the first control electrode 13 is not affected by the resistor 75. Accordingly, the first control electrode 13 can be rapidly charged. Thus, when the semiconductor device 100 is transitioned from the "off" state to the "on" state, it is possible to reliably turn "on" the normally-off transistor 10 earlier than the normally-on transistor 20.

In addition, by providing the resistor 75, the timing of turning "off" the normally-off transistor 10 can be delayed by a desired time from the timing of turning "off" the normally-on transistor 20.

In addition, a case is considered where 0 V is output by the signal source 97 and the gate drive circuit 96, and thus, both the normally-off transistor 10 and the normally-on transistor 20 are turned "off". If a high voltage is applied to the fourth electrode 22, the voltage of the third electrode 21 becomes high. At this time, there is a concern that the "off" state of the normally-on transistor 20 may not be maintained. For this reason, by providing the second diode 90, the gate drive circuit 96 and the second control electrode 23 are short-circuited, so that the "off" state of the normally-on transistor 20 is maintained.

Next, functions and effects of the semiconductor device 100 of this embodiment are described.

Figure 4:
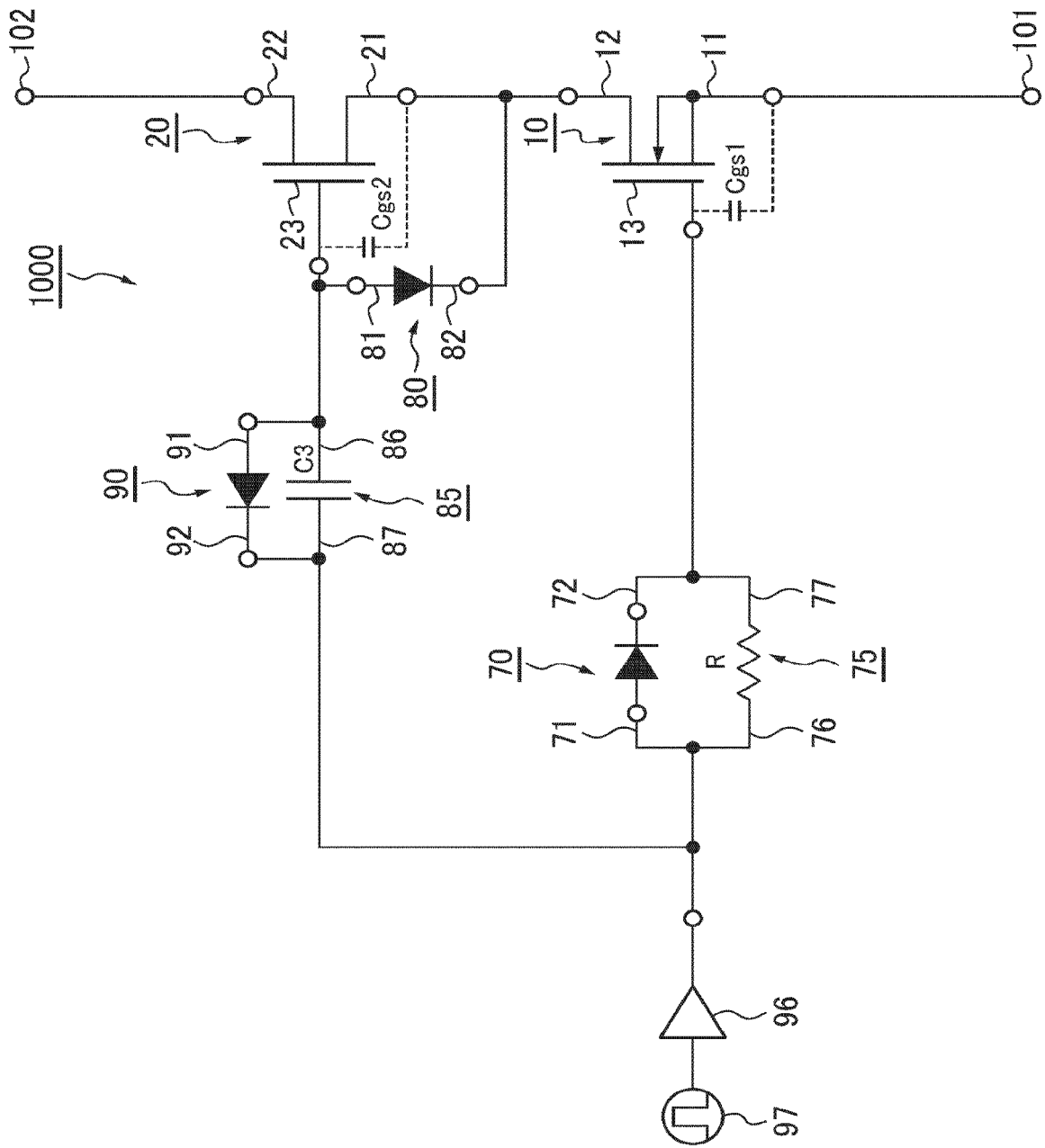
FIG. 4 is a circuit diagram of a semiconductor device as a comparative form of the first embodiment.

FIG. 4 is a circuit diagram of a semiconductor device 1000 according to a comparative form of this embodiment. The semiconductor device 1000 is different from the semiconductor device 100 in that the first element 1 and the second element 5 are not provided.

For example, in a case where the normally-on transistor 20 is an HEMI using a GaN (gallium nitride)-based semiconductor, in order to turn "off" the normally-on transistor 20, it is preferable that the absolute value of the negative voltage ($V_F$−$V_{g\_on}$) is, for example, about 7 V or more and 15 V or less. Herein, since $V_F$ is generally as small as about 1 V, it is preferable that $V_{g\_on}$ is, for example, about 8 V or more and 16 V or less.

However, in a case where such $V_{g\_on}$ is input between the first control electrode 13 and the first electrode 11, since $V_{g\_on}$ is too high, there is a concern that the normally-off transistor 10 is destroyed.

In order to suppress the destruction of the normally-off transistor 10, it is considered that the signal source and the gate drive circuit are provided to each of the normally-off transistor 10 and the normally-on transistor 20. However, since the two signal sources and the two gate drive circuits are provided in one semiconductor device 100, there is a problem in that the structure becomes complicated.

In addition, in order to simplify the structure, it is considered that the second control electrode 23 is electrically connected to the first electrode 11. However, in this case, there is a problem in that it is difficult to control on and off of the normally-on transistor 20.

The semiconductor device 100 of this embodiment includes the first element 1 having the first end portion 2 electrically connected to the first control electrode 13 and the second end portion 3 electrically connected to the first electrode 11 and including a first capacitance component. In addition, the semiconductor device 100 of this embodiment includes the second element 5 having the third end portion 6 electrically connected to the first control electrode 13 and the first end portion 2 and the fourth end portion 7, and the second element 5 includes a second capacitance component.

The voltage $V_{g\_on}$ output from the gate drive circuit 96 is divided by the first capacitance component and the second capacitance component to be input between the first control electrode 13 and the first electrode 11. That is, since the voltage lower than $V_{g\_on}$ is input between the first control electrode 13 and the first electrode 11, a concern that the normally-off transistor 10 is destroyed is suppressed. For this reason, it is possible to provide a semiconductor device having a simple structure.

In addition, when a threshold voltage of the normally-off transistor 10 is denoted by $V_{th}$, a maximum rated gate voltage of the normally-off transistor 10 is denoted by $V_{g\_max}$, a voltage of the fourth end portion 7 is denoted by $V_{g\_on}$, the first capacitance component is denoted by $C_a$, and the second capacitance component is denoted by $C_b$, it is preferable that $V_{th}<(C_b/(C_a+C_b))\, V_{g\_on}<V_{g\_max}$. Herein, $(C_b/(C_a+C_b))\, V_{g\_on}$ is a voltage obtained by dividing the voltage $V_{g\_on}$ by the first capacitance component and the second capacitance component. In order to turn "on" the normally-off transistor 10, it is preferable that $V_{th}<(C_b/(C_a+C_b))\, V_{g\_on}$. In addition, in order not to destroy the normally-off transistor 10, it is preferable that $(C_b/(C_a+C_b))\, V_{g\_on}<V_{g\_max}$.

According to the semiconductor device of this embodiment, it is possible to provide a semiconductor device having a simple structure.

Second Embodiment

In a semiconductor device of this embodiment, the first element 1 is a first Zener diode 50 having a first anode 51 and a first cathode 52 and including a first junction capacitance $C_x$. The first end portion 2 is the first cathode 52, the second end portion 3 is the first anode 51, and the first capacitance component $C_a$ is the first junction capacitance $C_x$. In addition, the second element 5 is a second Zener diode 60 having a second anode 61 and a second cathode 62 and including a second junction capacitance $C_y$, the third end portion 6 is the second anode 61, the fourth end portion 7 is the second cathode 62, and the second capacitance component $C_b$ is the second junction capacitance $C_y$.

Herein, description of contents overlapped with the first embodiment is omitted.

Figure 5:
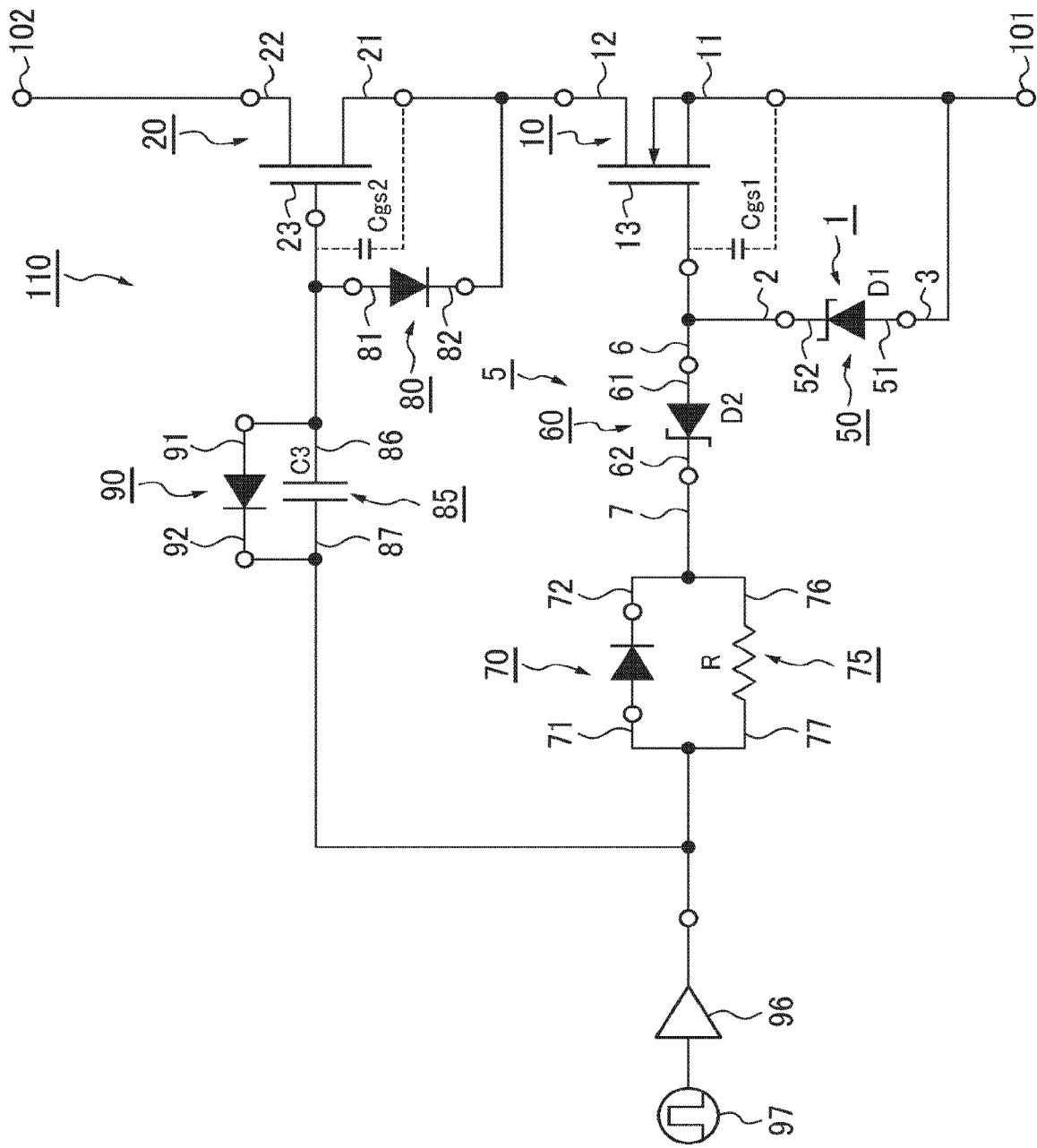
FIG. 5 is a circuit diagram of a semiconductor device of a second embodiment.

FIG. 5 is a circuit diagram of a semiconductor device 110 of this embodiment.

The first Zener diode 50 has a function of allowing the charges accumulated in the first control electrode 13 to escape from the first cathode 52 to the first anode 51 when the voltage of the first control electrode 13 becomes too high. In addition, the first junction capacitance $C_x$ of the first Zener diode 50 is used as the first capacitance component $C_a$.

When the first breakdown voltage of the first Zener diode 50 is denoted by $V_z(D_1)$, it is preferable that $V_z(D_1)<V_{g\_max}$. If $V_z(D_1) \geq V_{g\_max}$, a voltage of $V_{g\_max}$ or more is input between the first control electrode 13 and the first electrode 11, and thus, there is a concern that the normally-off transistor 10 is destroyed.

In a case where the voltage input between the first control electrode 13 and the first electrode 11 is too low, the second Zener diode 60 has a function of increasing the voltage input between the first control electrode 13 and the first electrode 11 by the voltage output from the gate drive circuit 96. In addition, the second junction capacitance $C_y$ of the second Zener diode 60 is used as the second capacitance component $C_b$.

When the second breakdown voltage of the second Zener diode 60 is denoted by $V_z(D_2)$, it is preferable that $V_z(D_2)<V_{g\_on}-V_{th}$. This means that, since the voltage input between the first control electrode 13 and the first electrode 11 corresponding to the amount of the second breakdown voltage of the second Zener diode 60 is lowered, in order to operate the normally-off transistor 10, it is preferable to increase the voltage $V_{g\_on}$ output from the gate drive circuit 96 so as to compensate for this.

In other words, the range of voltage input between the first control electrode 13 and the first electrode 11 is limited by the first Zener diode 50 and the second Zener diode 60. For this reason, the operation of the normally-off transistor 10 is stabilized, and thus, the occurrence of destruction is further suppressed.

According to the semiconductor device of this embodiment, it is possible to provide a semiconductor device having a simple structure.

Third Embodiment

A third embodiment is different from the first embodiment in that, in a semiconductor device of this embodiment, the first Zener diode 50 is connected in parallel with the first capacitor 30, and the second Zener diode 60 is connected in parallel with the second capacitor 40.

Herein, description of contents overlapped with the first and second embodiments will be omitted.

Figure 6:
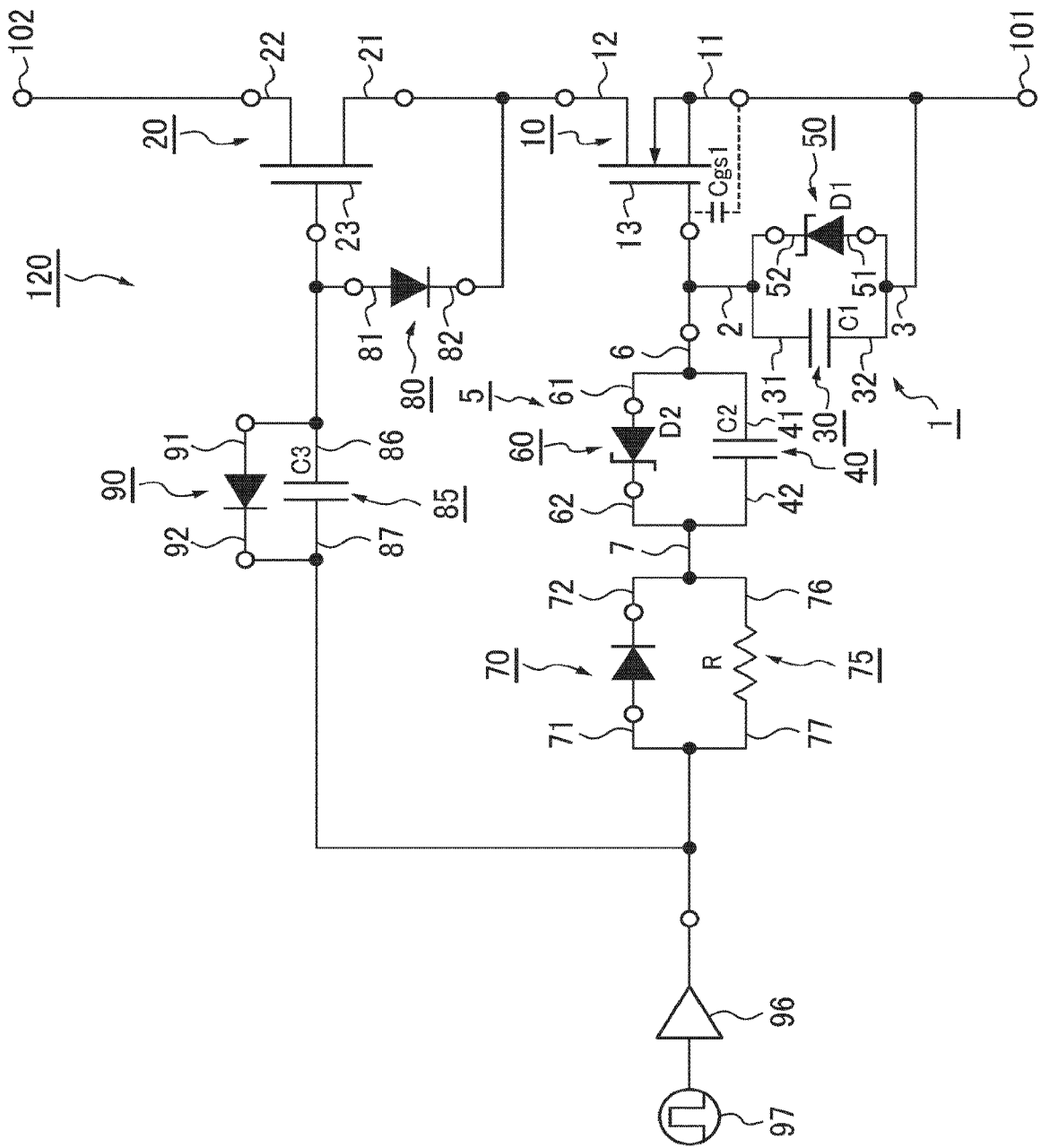
FIG. 6 is a circuit diagram of a semiconductor device of a third embodiment.

FIG. 6 is a circuit diagram of a semiconductor device 120 of this embodiment.

The first cathode 52 of the first Zener diode 50 is electrically connected to the fifth end portion 31 of the first capacitor 30. The first anode 51 of the first Zener diode 50 is electrically connected to the sixth end portion 32 of the first capacitor 30. The first Zener diode 50 is connected in parallel with the first capacitor 30.

In addition, the second anode 61 of the second Zener diode 60 is electrically connected to the seventh end portion 41 of the second capacitor 40. The second cathode 62 of the second Zener diode 60 is electrically connected to the eighth end portion 42 of the second capacitor 40. The second Zener diode 60 is connected in parallel with the second capacitor 40.

The first capacitance component $C_a$ and the second capacitance component $C_b$ are preferably the first capacitance $C_1$ of the first capacitor 30 and the second capacitance $C_2$ of the second capacitor 40, respectively. There is a possibility that the first junction capacitance $C_x$ of the first Zener diode 50 and the second junction capacitance $C_y$ of the second Zener diode 60 are changed by an applied voltage. For this reason, the voltage $V_{g\_on}$ output from the gate drive circuit 96 can be easily estimated with high accuracy by using the first capacitance $C_1$ of the first capacitor 30 and the second capacitance $C_2$ of the second capacitor 40.

In addition, in order to estimate the voltage $V_{g\_on}$ with higher accuracy, it is preferable that the first capacitance component $C_a$ is set to a combined capacitance $(C_1 C_x/(C_1 + C_x))$ in a case where the first capacitance $C_1$ of the first capacitor 30 and the first junction capacitance $C_x$ of the first Zener diode 50 are connected in parallel. In addition, it is preferable that the second capacitance component $C_b$ is set to a combined capacitance $(C_2 C_y/(C_2 + C_y))$ in a case where the second capacitance $C_2$ of the second capacitor 40 and the second junction capacitance $C_y$ of the second Zener diode 60 are connected in parallel.

According to the semiconductor device of this embodiment, it is possible to provide a semiconductor device having a simple structure.

While certain embodiments have been described, these embodiments have been presented by way of example only, and are not intended to limit the scope of the inventions. Indeed, SEMICONDUCTOR DEVICE described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a normally-off transistor having a first electrode, a second electrode, and a first control electrode;
   a normally-on transistor having a third electrode electrically connected to the second electrode, a fourth electrode, and a second control electrode;
   a first element having a first end portion electrically connected to the first control electrode and a second end portion electrically connected to the first electrode, and the first element including a first capacitance component; and
   a second element having a third end portion electrically connected to the first control electrode and the first end portion and a fourth end portion, and the second element including a second capacitance component,
   wherein, when a threshold voltage of the normally-off transistor is denoted by $V_{th}$, a maximum rated gate voltage of the normally-off transistor is denoted by $V_{g\_max}$, a voltage of the fourth end portion is denoted by $V_{g\_on}$, the first capacitance component is denoted by $C_a$, and the second capacitance component is denoted by $C_b$, $V_{th} < (C_b/(C_a + C_b)) V_{g\_on} < V_{g\_max}$.

2. The semiconductor device according to claim 1,
   wherein the first element is a first Zener diode having a first anode and a first cathode, and the first element including a first junction capacitance, and
   wherein the first end portion is the first cathode, the second end portion is the first anode, and the first capacitance component is the first junction capacitance.

3. The semiconductor device according to claim 2,
   wherein, when the first breakdown voltage of the first Zener diode is denoted by $V_z(D_1)$, $V_z(D_1) < V_{g\_max}$.

4. The semiconductor device according to claim 1,
   wherein the first element is a first capacitor having a fifth end portion and a sixth end portion, and the first element includes a first capacitance, and
   wherein the first end portion is the fifth end portion, the second end portion is the sixth end portion, and the first capacitance component is the first capacitance.

5. The semiconductor device according to claim 4, further comprising a first Zener diode having a first cathode electrically connected to the first end portion and a first anode electrically connected to the second end portion, and the first Zener diode being connected in parallel with the first capacitor.

6. The semiconductor device according to claim 1,
   wherein the second element is a second Zener diode having a second anode and a second cathode, and the second element including a second junction capacitance, and
   wherein the third end portion is the second anode, the fourth end portion is the second cathode, and the second capacitance component is the second junction capacitance.

7. The semiconductor device according to claim 6,
   wherein, when the second breakdown voltage of the second Zener diode is denoted by $V_z(D_2)$, $V_z(D_2) < V_{g\_on} - V_{th}$.

8. The semiconductor device according to claim 1,
   wherein the second element is a second capacitor having a seventh end portion and an eighth end portion, and the second element includes a second capacitance, and wherein the third end portion is the seventh end portion, the fourth end portion is the eighth end portion, and the second capacitance component is the second capacitance.

9. The semiconductor device according to claim 8, further comprising a second Zener diode having a second anode electrically connected to the third end portion and a second cathode electrically connected to the fourth end portion, and the second Zener diode being connected in parallel with the second capacitor.

10. The semiconductor device according to claim 1, further comprising a first diode having a third anode electrically connected to the second control electrode and a third cathode electrically connected to the third electrode.

11. The semiconductor device according to claim 1, further comprising:
 a second diode having a fourth anode electrically connected to the second control electrode and a fourth cathode; and
 a third capacitor having a ninth end portion electrically connected to the fourth anode and a tenth end portion electrically connected to the fourth cathode, and the third capacitor being connected in parallel with the second diode.

12. The semiconductor device according to claim 1, further comprising:
 a third diode having a fifth cathode electrically connected to the fourth end portion and a fifth anode; and
 a resistor having an eleventh end portion electrically connected to the fifth cathode and a twelfth end portion electrically connected to the fifth anode, and the resistor being connected in parallel with the third diode.

13. The semiconductor device according to claim 1, further comprising a gate drive circuit electrically connected to the first control electrode and the second control electrode.

* * * * *